United States Patent
Kumagai

[19]

[11] Patent Number: 6,057,568
[45] Date of Patent: *May 2, 2000

[54] APPLICATION SPECIFIC INTEGRATED CIRCUIT SEMICONDUCTOR DEVICE HAVING MOS TRANSISTOR WITH REDUCED GATE RESISTANCE

[75] Inventor: Kouichi Kumagai, Tokyo, Japan

[73] Assignee: NEC Corporation, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/719,203

[22] Filed: Sep. 25, 1996

Related U.S. Application Data

[63] Continuation of application No. 08/365,593, Dec. 28, 1994, abandoned.

[30] Foreign Application Priority Data

Dec. 29, 1993 [JP] Japan ................................ 5-351532

[51] Int. Cl.[7] ........................... H01L 27/10; H01L 29/76; H01L 29/94
[52] U.S. Cl. ......................... 257/204; 257/206; 257/401; 257/369
[58] Field of Search ................... 257/369, 204, 257/206, 202, 401

[56] References Cited

U.S. PATENT DOCUMENTS

| | | | |
|---|---|---|---|
| 4,975,758 | 12/1990 | Crafts | 257/204 |
| 5,317,175 | 5/1994 | Throngnumchai | 257/206 |
| 5,397,906 | 3/1995 | Kumagai | 257/204 |

FOREIGN PATENT DOCUMENTS

| | | | |
|---|---|---|---|
| 59-150446 | 8/1984 | Japan | 257/206 |
| 60-47441 | 3/1985 | Japan | 257/206 |
| 62-244148 | 10/1987 | Japan | 257/206 |
| 63-37633 | 2/1988 | Japan | 257/206 |
| 2-105579 | 4/1990 | Japan | 257/204 |

Primary Examiner—Steven H. Loke

[57] ABSTRACT

A semiconductor integrated circuit is disclosed which avoids operating speed degradation resulting from an increase of the gate resistance due to making the size of the device small. In a basic cell 103 comprising a group 101 of P-channel MOS transistors and a group 102 of N-channel MOS transistors, the gate width of all the MOS transistors constituting the basic cell 103 is set below 7 μm, and the gate electrodes 108a, 108b, 109a, 109b are formed to surround the perimeter of source or drain diffusion areas 106a, 106c, 107a, 107c of the MOS transistors to form an electrically closed loop.

22 Claims, 9 Drawing Sheets

6,057,568

APPLICATION SPECIFIC INTEGRATED CIRCUIT SEMICONDUCTOR DEVICE HAVING MOS TRANSISTOR WITH REDUCED GATE RESISTANCE

This is a continuation of Application Ser. No. 08/365,593 filed on Dec. 28, 1994, abandoned.

FIELD OF THE INVENTION

The present invention relates to a semiconductor integrated circuit and, in particular, to a semiconductor integrated circuit of a CMOS gate array or CMOS standard cell type.

BACKGROUND OF THE INVENTION

In recent years, in the field of CMOS logic LSI technology, the driving efficiency of the transistor has been improved primarily by decreasing the length (L) of the gate of MOS transistor to realize high speed operation and high integration of the LSI. On the other hand, in order to suppress the increase of gate resistance and the degradation of operating speed of the circuit due to the reduction of the gate length, some processes such as silicide or salicide process, which attempt to reduce the resistance of the gate electrode, have become indispensable on the manufacturing of the device.

In CMOS-LSI using a polysilicon gate having a gate length of 0.5 $\mu$m to 0.35 $\mu$m, W (tungsten) polycide, Ti (titanium) silicide or Co (Cobalt) silicide has been put in practical use. However, as regards the MOS transistor having a gate length of below 0.25 $\mu$m, which is expected for practical use in the future, a technique for reducing the resistance of the gate electrode according to the foregoing W polycide, Ti silicide or Co silicide process has not yet been established.

Presently, as the internal basic cell of the application specific LSI (ASIC) of the CMOS, which is typically represented by the SOG (Sea-Of-Gates), standard cell type LSI or the like, one based on a layout disclosed in Japanese Patent Application Laid-Open No. 59-150446, which is shown in FIG. 1, has generally been adopted.

Referring to FIG. 1, reference numeral 701 denotes a group of P-channel MOS transistors, 702 a group of N-channel MOS transistors, 704 an N-well contact diffusion layer, 705 a P-well contact diffusion layer, 706a, 706b, 706c each a P$^+$-type diffusion layer, 707a, 707b, 707c an N$^+$-type diffusion layer, 708a, 708b a P-channel MOS gate, 709a, 709b an N-channel MOS gate.

That is, the basic cell of FIG. 1 comprises a group 701 of four P-channel MOS transistors and a group 702 of four N-channel MOS transistors. In the group 701, each two P-channel MOS transistors are connected in series in such a manner as sharing a source or drain area. In the group 702, each two N-channel MOS transistors are connected in series in such a manner as sharing a source or drain area. It is because the two-input NAND or NOR gate can efficiently be arranged that the transistors of the basic cell are laid out with each two of them connected in series sharing the source or drain area.

The gate width (W) of the basic cell is typically determined so that it becomes optimal to the standard load of the random logic. The standard load of the random logic comprises, for example, a fan-out number of 2 and an aluminum interconnection load of 2 mm, which corresponds to about 0.5 pF in terms of capacitance. In consequence, the gate width (W) of the basic cell which is presently put in practical use generally accounts for 10 $\mu$m to 20 $\mu$m.

FIG. 2A illustrates a layout view of a two-input NAND circuit on the basic cell of FIG. 1, and FIG. 2B is an equivalent circuit diagram of the layout of FIG. 2A.

Referring to FIGS. 2A and 2B, 804 denotes an N-well contact diffusion layer, 805 a P-well contact diffusion layer, 806a, 806b, 806c a P$^+$-type diffusion layer, 807a, 807b, 807c an N$^+$-type diffusion layer, 808a, 808b a P-channel MOS gate, 809a, 809b an N-channel MOS gate, 810 a power line, 811 a ground line, 812 a first input terminal line, 813 a second input terminal line, 814 an output terminal line, and 815 a contact.

Referring to FIG. 2A, the power supply potential is given from the power line 810 through the contact 815 to the N-well contact diffusion layer 804 and the P$^+$-type diffusion layers 806a, 806c, and the ground potential is given from the ground line 811 through the contact 815 to the P-well contact diffusion layer 805 and the N$^+$-type diffusion layer 807a.

The P-channel MOS gate 808a and the N-channel MOS gate 809a are connected to each other with the second input terminal line 813, and the P-channel MOS gate 808b and the N-channel MOS gate 809b are connected to each other with the first input terminal line 812, and the P$^+$-type diffusion layer 806b and the N$^+$-type diffusion layer 807c are connected to each other with an output terminal line 814.

Now, it is supposed that a transistor of the basic cell has a gate length (L) of 0.25 $\mu$m, a gate width (W) of 10 $\mu$m and a thickness ($t_{ox}$) of gate oxide film of 7 $\mu$nm. In the transistor of 0.25 $\mu$m gate length (L) rule, assuming that the P-channel MOS transistor is of a surface channel type, the P-channel MOS gates 808a, 808b of FIG. 2A can be formed with a P-type polysilicon, and the N-channel MOS gates 809a, 809b of FIG. 2A can be formed with an N-type polysilicon.

Such a structure comprising the P-channel MOS gate of P-type polysilicon and the N-channel MOS gate of N-type polysilicon as in the above is typically called a PN gate structure or a dual gate structure. Accordingly, if the gate resistance ($R_g$) is calculated with the sheet resistance ($\rho_s$) of the P-type polysilicon and N-type polysilicon taken as 300 $\Omega/\square$ and 100 $\Omega/\square$ respectively, then the following result is obtained.

P-channel MOS gate: $R_{gP}$=12 k$\Omega$

N-channel MOS gate: $R_{gN}$=4 k$\Omega$

On the other hand, since the gate capacitance ($C_g$) via the gate oxide film becomes 12.3 fF, the time constant ($\tau_g$) of the gate per se becomes as follows:

P-channel MOS gate: $\tau_{gP}=R_{gP} \times C_g$=148 ps

N-channel MOS gate: $\tau_{gN}=R_{gN} \times C_g$=49.2 ps

In the CMOS device having a gate length of 0.25 $\mu$m, it is anticipated that the propagation delay time ($t_{pd}$) of the inverter circuit when the gate resistance is neglected equals about 60 ps while it is anticipated that the propagation delay time ($t_{pd}$) when the foregoing time constant of the gate is taken into account equals about 120 ps. As described above, in the CMOS device of the PN gate structure having a gate length of 0.25 $\mu$m or below, the effect exerted on the propagation delay time ($t_{pd}$) by the gate resistance cannot be ignored.

In other words, if the PN gate structured CMOS device having the gate length of 0.25 $\mu$m or below is made according to the conventional basic cell layout to improve the operational characteristics thereof, a process of the gate silicide, salicide or the like aiming at making the gate resistance smaller becomes indispensable. However, as described above, a silicide technique for reducing the resistance of the polysilicon gate having the gate length of 0.25 µm or below stably with a good yield has not yet been established.

If the gate resistance is taken into account in this manner, then the two-input NAND circuit illustrated in FIG. 2B can be represented by an equivalent circuit as shown in FIG. 2C, in which equivalent gate resistances 816a through 816d are added to the gates.

On the other hand, in order to reduce the gate resistance by the layout technique, it has been proposed to improve the gate configuration. As a conventional gate configuration of the basic cell, there is a cell layout as shown in FIG. 3, which is disclosed in Japanese Patent Application Laid-Open No. 60-47441.

Referring to FIG. 3, 901a, 901b each denote P-channel MOS transistor group, 902a, 902b an N-channel MOS transistor group, 904a, 904b, 904c an N-well contact diffusion layer, 905a, 905b, 905c a P-well contact diffusion layer, 906a, 906b, 906c, 906d, 906e, 906f, 906g a P$^+$-type diffusion layer, 907a, 907b, 907c, 907d, 907e, 907f, 907g an N$^+$-type diffusion layer, 908a, 908b, 908c, 908d a P-channel MOS gate, 909a, 909b, 909c, 909d an N-channel MOS gate.

That is, the basic cell of FIG. 3 comprises the group 901b of two P-channel MOS transistors connected in series in such a manner as sharing the source or drain area, the group 901a of two P-channel MOS transistors each having the gate electrode extending along the periphery of the source or drain diffusion area, the group 902b of two N-channel MOS transistors connected in series in such a manner as sharing the source or drain area, and the group 902a of two N-channel MOS transistors each having the gate electrode extending along the periphery of the source or drain diffusion area. The basic cell contains eight MOS transistors.

The feature of this conventional basic cell layout lies in that, as shown by 908c, 908d, 909c and 909d of FIG. 3, the gate electrode is made to extend about the source or drain diffusion area. However, this is intended to improve the configuration of the gate electrode aiming at laying out the functional block, in particular the memory cell, efficiently, and not to realize reduction of the resistance of the gate electrode which the present invention intends to achieve.

As described above, in the conventional basic cell structure of the semiconductor integrated circuit, since the gate width of each transistor which constitutes the cell is set aiming at driving the standard load, if a similar cell layout is used for a CMOS device having a gate length of 0.25 µm or below, then the gate resistance is increased, and the operating speed of the circuit is reduced.

Further, in order to reduce the gate resistance by using a specific manufacturing process, the number of manufacturing step has been increased as in the silicide or salicide process or the like.

SUMMARY OF THE INVENTION

The present invention was conceived in order to solve the foregoing problems, and the object thereof is to provide a semiconductor integrated circuit which suppresses the degradation of the operating speed of the circuit, which would otherwise result from the increase of the resistance of small-sized gate electrode.

In order to achieve the foregoing end, according to the present invention, there is provided a semiconductor integrated circuit of gate array or standard cell type having a plurality of basic cells each including a plurality of CMOS transistors each comprising a P-channel MOS transistor and an N-channel MOS transistor, the P-channel MOS transistor and the N-channel MOS transistor having a gate electrode formed to surround the perimeter of a source or drain diffusion area to form an electrically closed loop.

The gate electrode of the P-channel MOS transistor may be formed of P-type polysilicon, and the gate electrode of the N-channel MOS transistor may be formed of N-type polysilicon. The basic cell may be formed on an SOI substrate. A gate width of the P-channel MOS transistor and the N-channel MOS transistor may be equal to or less than 7 µm, preferably equal to or less than 5 µm, and greater than 0 µm. A gate length of the P-channel MOS transistor and the N-channel MOS transistor may be equal to or less than 0.3 µm, preferably equal to or less than 0.25 µm, and greater than 0 µm.

Further, according to the present invention, there is provided a semiconductor integrated circuit of gate array or standard cell type which comprises a plurality of basic cells including a group of CMOS transistors including a group of P-channel MOS transistors and a group of N-channel MOS transistors wherein the gate width of all the MOS transistors constituting the basic cell is 5 µm or below, the gate electrode of the MOS transistor is formed to surround the perimeter of the source or drain diffusion area of the MOS transistor to form an electrically closed loop.

Further, the present invention has a feature that the gate electrode of all the P-channel MOS transistors which constitutes the basic cell is formed of a P-type polysilicon, and that the gate electrode of all the N-channel transistor which constitute the basic cell is formed of an N-type polysilicon. Further, the foregoing basic cell can be formed on an SOI substrate.

According to the semiconductor integrated circuit of the foregoing structure, since the gate width of all the MOS transistors which constitute the basic cell is equal to or less than 7 µm, preferably equal to or less than 5 µm, and the gate electrode is formed to surround the perimeter of the source or drain diffusion area of the MOS transistor to form an electrically closed loop, it becomes possible to suppress the influence of the gate resistance on the operating speed of the circuit without the gate silicide or salicide process.

Further, if the gate electrode of all the P-channel MOS transistors which constitutes the basic cell is formed of the P-type polysilicon and the gate electrode of the N-channel MOS transistor which constitutes the basic cell is formed of the N-type polysilicon, the influence of the gate resistance on the propagation delay time can be suppressed sufficiently.

Still further, if the basic cell is formed on the SOI substrate, the N- and P-well contact diffusion layers can be eliminated from the basic cell, and the gate capacitance can be reduced.

BRIEF DESCRIPTION OF THE DRAWINGS

FIG. 8A is a partially enlarged view of the P-channel MOS gate portion, FIG. 8B is an equivalent circuit diagram of the gate resistance and FIG. 8C is a view for explaining the gate capacitance;

DESCRIPTION OF THE PREFERRED EMBODIMENTS

Specific embodiments of the present invention is hereinafter described in greater detail with reference to the accompanying drawings.

Figure 4A:
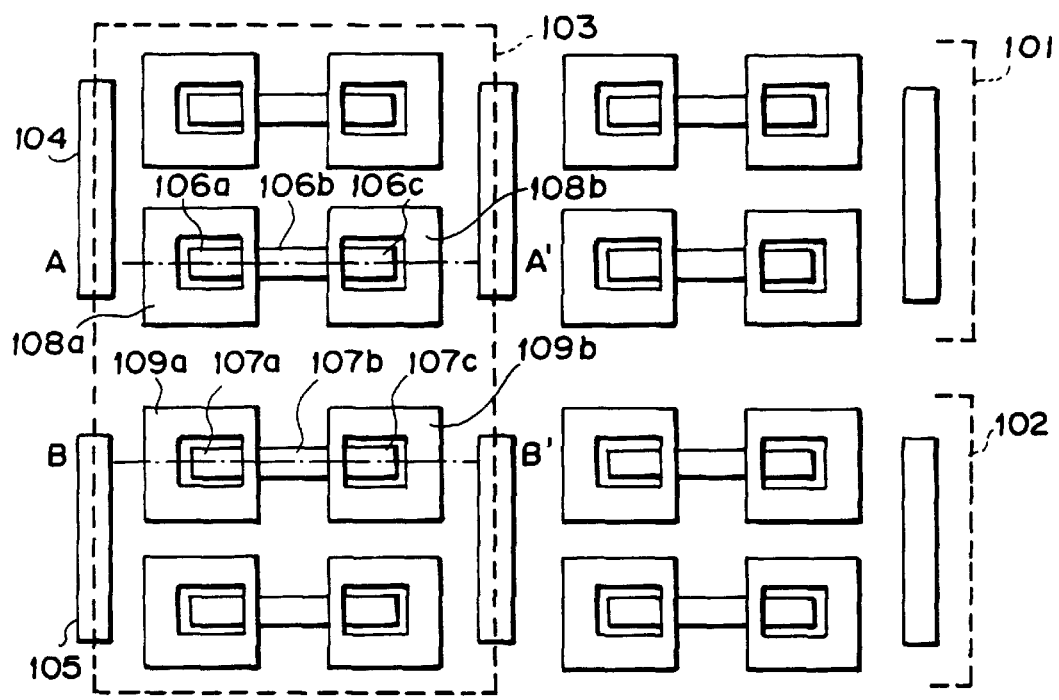
FIG. 4A is a plan view illustrating a layout of a basic cell array according to a first embodiment of the present invention.

FIG. 4A is a view of an internal basic cell layout of an LSI illustrating a first embodiment of the present invention, in which reference numeral 101 denotes a group of P-channel MOS transistors, 102 a group of N-channel MOS transistors, 103 a basic cell, 104 an N-well contact diffusion layer, 105 a P-well contact diffusion layer, 106a, 106b, 106c each a P$^+$-type diffusion layer, 107a, 107b, 107c an N$^+$-type diffusion layer, 108a, 108b a P-channel MOS gate (electrode), and 109a, 109b an N-channel MOS gate (electrode).

That is, the basic cell 103 according to this embodiment comprises a group 101 of four P-channel MOS transistors and a group 102 of four N-channel MOS transistors. In the group 101, respective pairs of P-channel MOS transistors are connected in series to share a source or drain area 106b. In the group 102, respective pairs of N-channel MOS transistors are connected in series to share a source or drain area 107b.

The P-channel MOS gates 108a, 108b have a gate width (W$_P$) below 5 µm and surround the P$^+$-type diffusion layers 106a, 106c respectively. Also, the N-channel MOS gates 109a, 109b have a gate width (W$_N$) below 5 µm and surround the N$^+$-type diffusion layers 107a, 107c respectively. The P-channel MOS gates 108a, 108b and the N-channel MOS gates 109a, 109b each form an electrically closed loop.

Figure 4B:
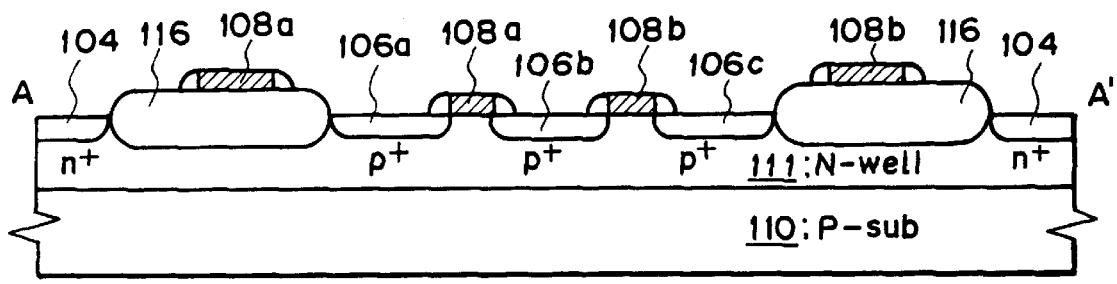
FIG. 4B is a cross-sectional view of the interior of a P-channel MOS transistor prtion of a basic cell.
Figure 4C:
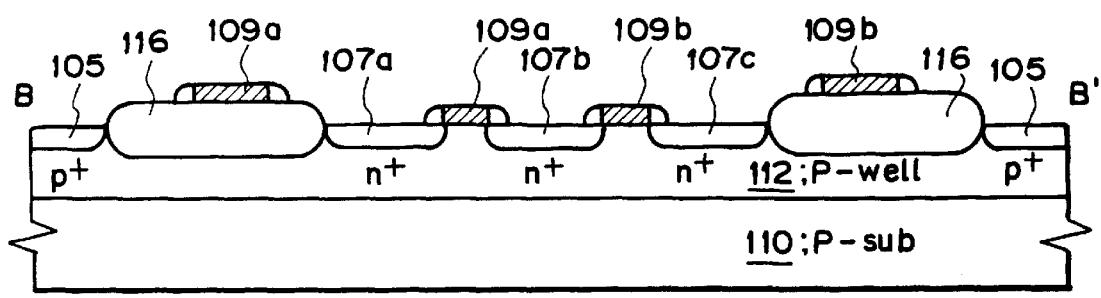
FIG. 4C is a cross-sectional view of the interior of an N-channel MOS transistor portion of the basic cell.

FIG. 4B is a cross-sectional view of the P-channel MOS transistor portion taken along the line A–A' of FIG. 4A, and FIG. 4C is a cross-sectional view of the N-channel MOS transistor portion taken along the line B–B' of FIG. 4A.

In the cross-sectional views of FIGS. 4B and 4C, 110 denotes a P-type substrate (P-sub), 111 an N-well layer (N-well), 112 a P-well layer (P-well) and 116 an isolation oxide film.

Referring to the cross-sectional view of FIG. 4B, the P-channel MOS gates 108a, 108b of the basic cell 103 according to this embodiment are formed at the transistor portion and on the isolation oxide film 116. Referring also to the cross-sectional view of FIG. 4C, as in FIG. 4B, the N-channel MOS gates 109a, 109b of the basic cell 103 according to this embodiment are formed at the transistor portion and on the isolation oxide film 116.

In this embodiment, a PMOS and an NMOS are of surface channel type having a gate length (L) of 0.25 µm, and the P-channel MOS gates 108a, 108b are formed of P-type polysilicon, and the N-channel MOS gates 109a, 109b are formed of N-type polysilicon.

Figure 1:
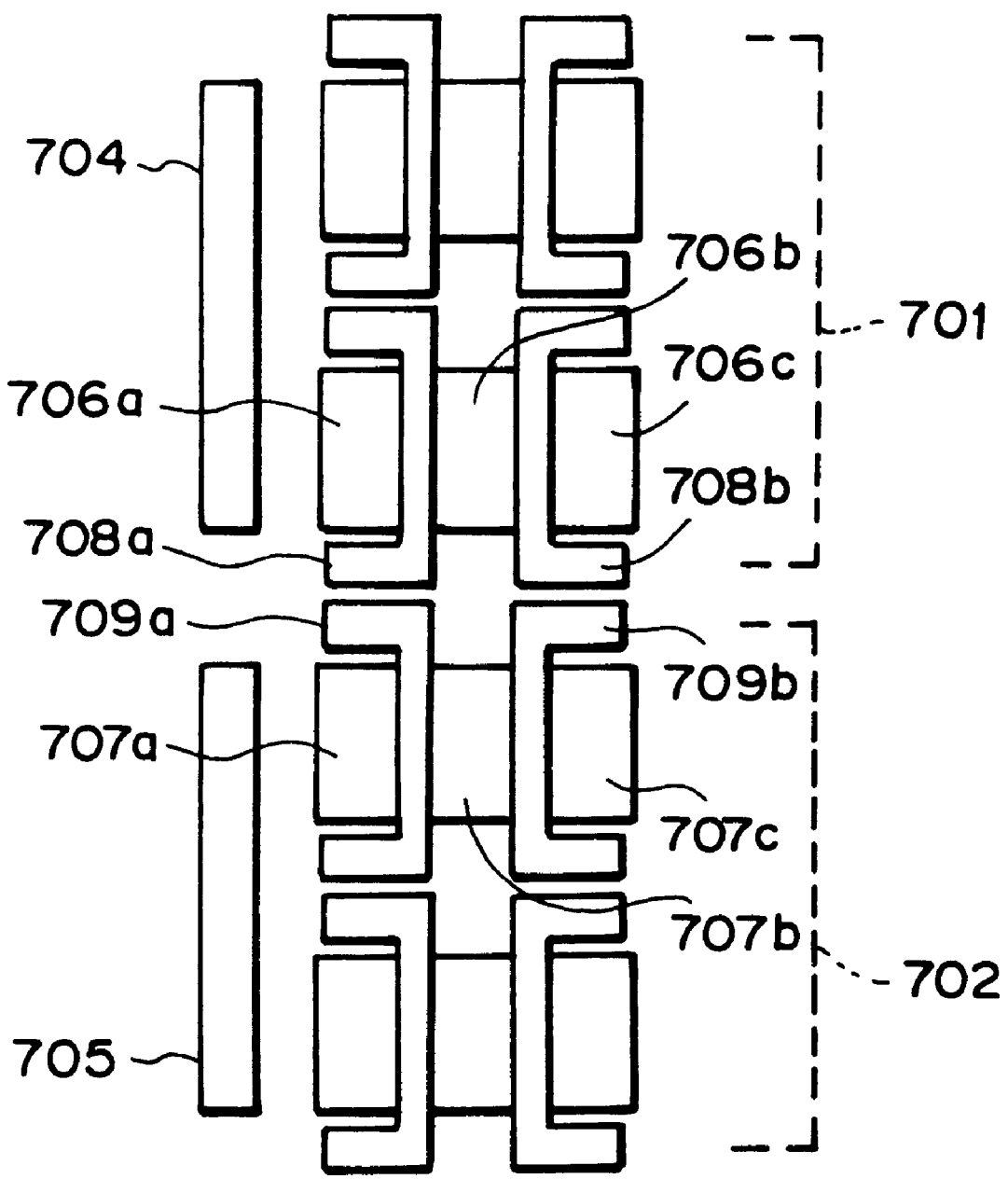
FIG. 1 is a view illustrating a conventional layout of the basic cell.
Figure 2A:
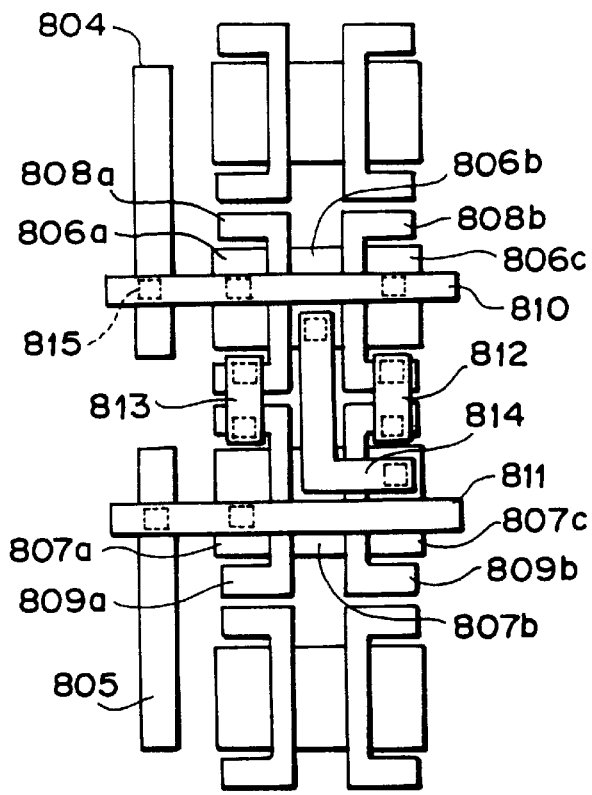
FIG. 2A is a wiring layout of a two-input NAND circuit of the conventional basic cell, FIG. 2B being an equivalent circuit diagram thereof, FIG. 2C an equivalent circuit diagram taking the gate resistance into account.
Figure 2B:
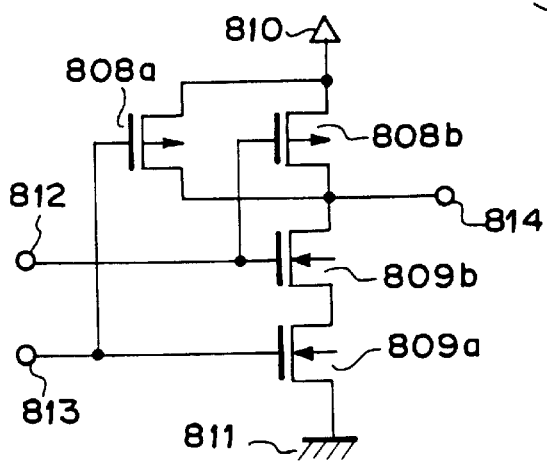
Figure 2C:
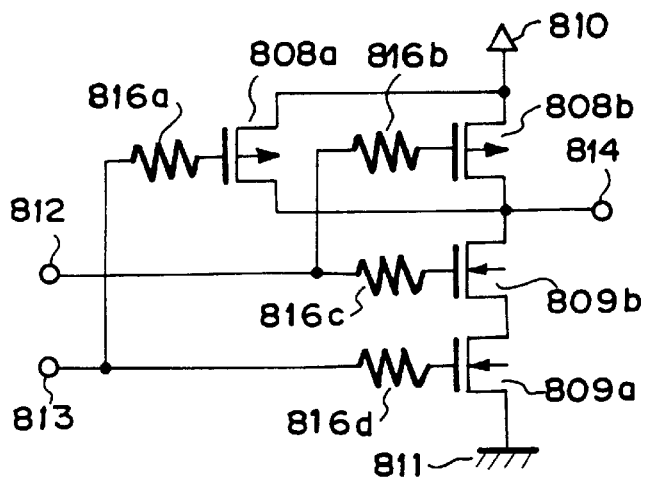
Figure 3:
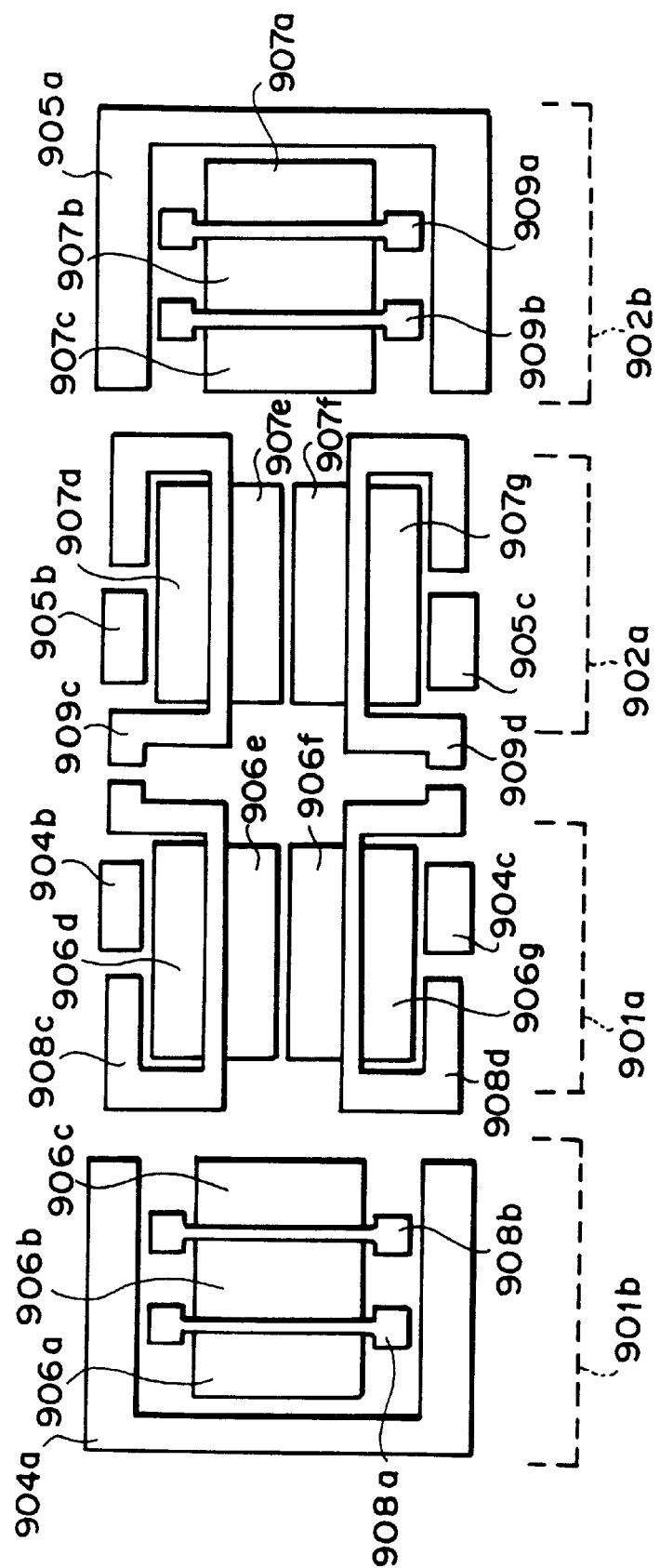
FIG. 3 is a view illustrating a still another conventional layout of the basic cell.
Figure 5A:
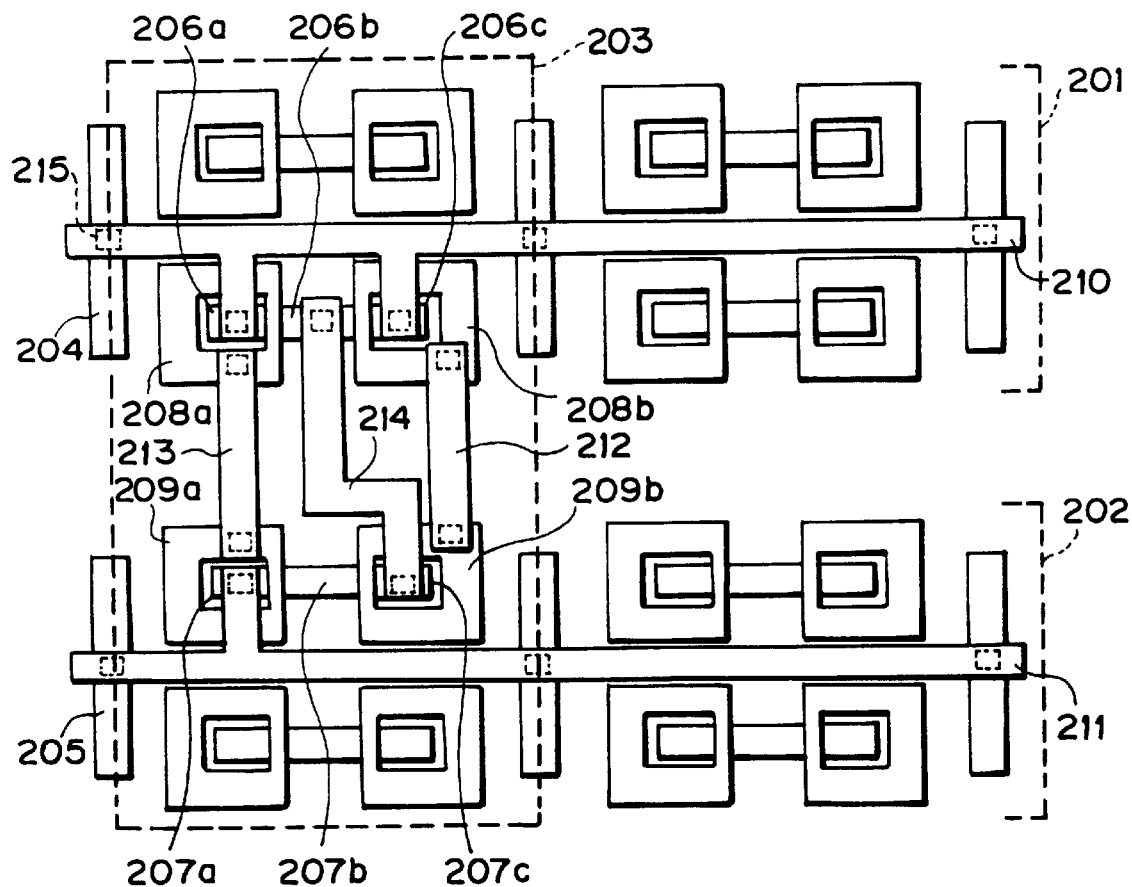
FIG. 5A is a plan view of the wiring layout of a two-input NAND circuit according to the first embodiment of the present invention.
Figure 5B:
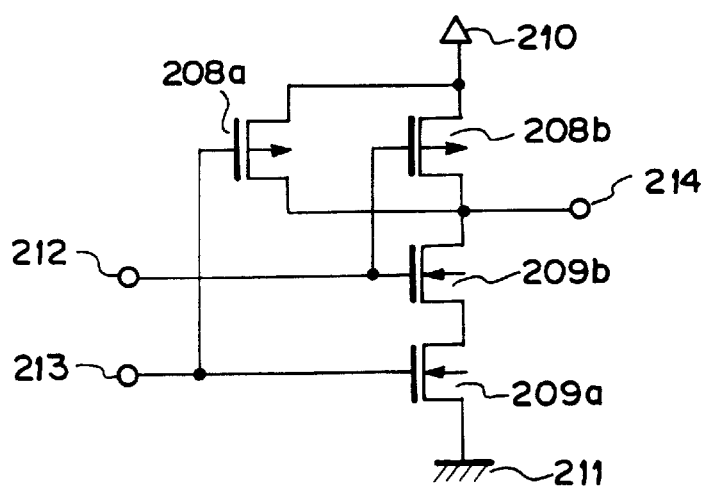
FIG. 5B is an equivalent circuit diagram thereof.

FIG. 5A shows a layout in which an interconnection pattern of two-input NAND circuit is laid out on the basic cell array of FIG. 1, and FIG. 5B is an equivalent circuit diagram of the two-input NAND circuit.

In FIGS. 5A and 5B, 201 denotes a group of P-channel MOS transistors, 202 a group of N-channel MOS transistors, 203 a basic cell, 204 an N-well contact diffusion layer, 205 a P-well contact diffusion layer, 206a, 206b, 206c each a P$^+$-type diffusion layer, 207a, 207b, 207c an N$^+$-type diffusion layer, 208a, 208b a P-channel MOS gate, 209a, 209b an N-channel MOS gate, 210 a power line, 211 a ground line, 212 a first input terminal line, 213 a second input terminal line, 214 an output terminal line, and 215 a contact.

In this embodiment, the power supply potential is given from the power line 210 through the contact 215 to the N-well contact diffusion layer 204 and the P$^+$-type diffusion layers 206a, 206c, and the ground potential is given from the ground line 211 through the contact 215 to the P-well contact diffusion layer 205 and the N$^+$-type diffusion layer 207a.

The P-channel MOS gate 208a and the N-channel MOS gate 209a are connected to each other with the second input terminal line 213, and the P-channel MOS gate 208b and the N-channel MOS gate 209b are connected to each other with the first input terminal line 212, and the P$^+$-type diffusion layer 206b and the N$^+$-type diffusion layer 207c are connected to each other with an output terminal line 214.

Figure 8A:
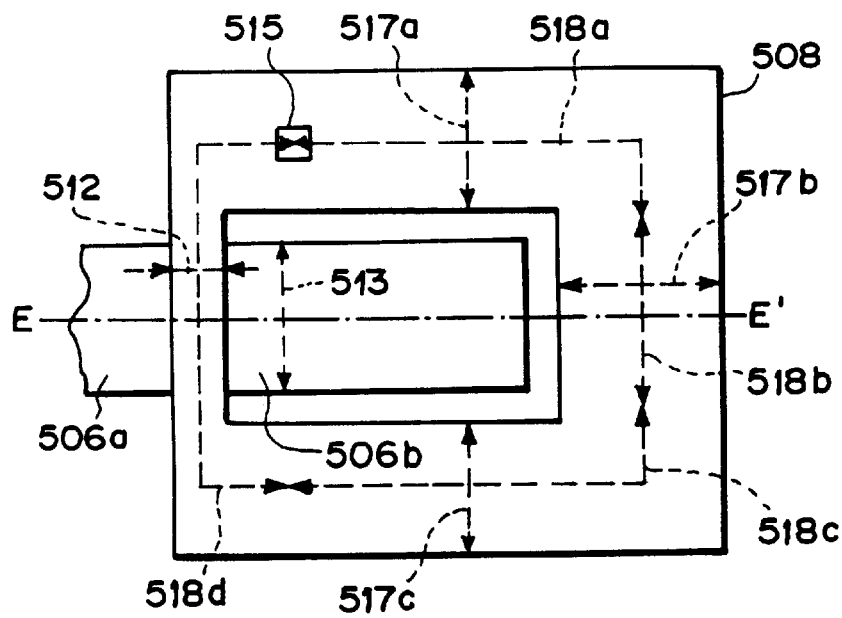
FIGS. 8A through 8C are respectively a view for explaining the MOS gate resistance and capacitance according to the present invention, in particular.
Figure 8B:
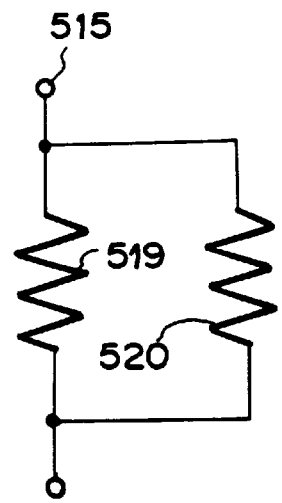
Figure 8C:
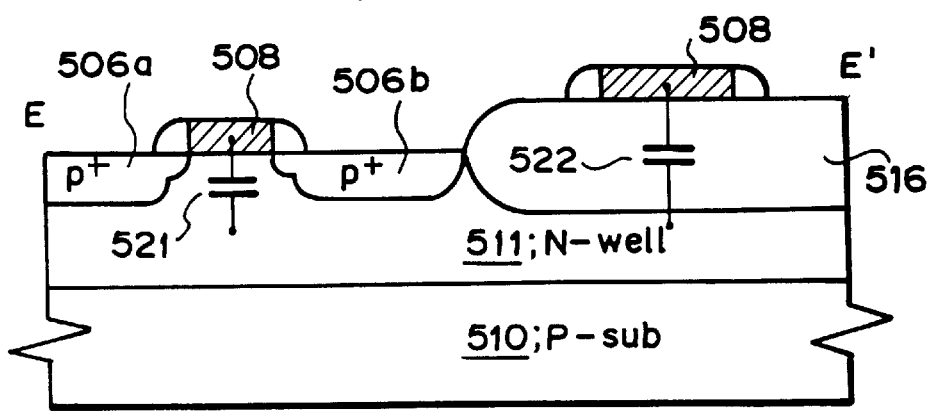

The gate resistance and the gate capacitance in this embodiment are analyzed with reference to FIGS. 8A through 8C. FIG. 8A is a partially enlarged view of the P-channel MOS gate 108b of this embodiment, FIG. 8B is an equivalent circuit diagram of the resistance of the gate, and FIG. 8C is a cross-sectional view taken along line E–E' of FIG. 8A.

In FIGS. 8A through 8C, 506a, 506b each denote a P$^+$-type diffusion layer, 508 a P-channel MOS gate, 510 a P-type substrate (P-sub), 511 an N-well layer (N-well), 512 a gate length (L), 513 a gate width (W), 515 a contact, 516 an isolation oxide film, 517a, 517b, 517c the width (W$_a$, W$_b$, W$_c$) of a respective gate contact portion, 518a, 518b, 518c, 518d the length (L$_a$, L$_b$, L$_c$, L$_d$) of a gate electrode, 519 the resistance (R$_{g1}$) of a gate channel portion, 520 the resistance (R$_{g2}$) of the gate contact portion, 521 the capacitance (C$_{g1}$) of the gate channel portion, and 522 the capacitance (C$_{g2}$) of the gate contact portion.

Assuming that a signal is given from the contact 515 of FIG. 8A and that the gate length (L) 512 is set to 0.25 µm, the widths 517a through 517c of the gate contact portions and the lengths 518a through 518d of the gate electrodes are each set as follows with the gate width (W) 513 taken as a parameter.

Widths 517a, 517b, 517c of the gate contact portion $$W_a = W_b = W_c = 2 \ \mu m$$

Lengths 518a, 518c of the gate electrode $$L_a = L_c = 4 \ \mu m$$

Lengths 518b of the gate electrode $$L_b = W + 0.5 \ \mu m$$

Lengths 518d of the gate electrode $$L_d = W + 2.5 \ \mu m$$

If, by way of example, with the gate width (W) 513 set to 5 μm, the resistance ($R_{g1}$) 519 of the gate channel portion and the resistance ($R_{g2}$) 520 of the gate contact portion in FIG. 8B are evaluated, then the following results are obtained.

Resistance 519 of the gate channel portion $$R_{g1} = 2.6 \ k\Omega$$

Resistance 520 of the gate contact portion $$R_{g2} = 6.9 \ k\Omega$$

Further, if the capacitance ($C_{g1}$) 521 of the gate channel portion and the capacitance ($C_{g2}$) 522 of the gate contact portion in FIG. 8C are evaluated with the thickness of the isolation oxide film 516 set to 5000 Å, then the following results are obtained.

Capacitance 521 of the gate channel portion $$C_{g1} = 3.1 \ fF$$

Capacitance 522 of the gate contact portion $$C_{g2} = 1.4 \ fF$$

From the foregoing data, the time constant ($\tau_{gp}$) which the P-channel MOS gate has becomes as follows;

$$\tau_{gp} = 16.8 \ ps$$

and, the time constant ($\tau_g$) combined with the N-channel MOS gate becomes as follows:

$$\tau_g = 22.4 \ ps$$

As described above, according to the basic cell structure of the present invention, the influence of the gate resistance upon the propagation delay time ($t_{pd}$) can be reduced.

Figure 9:
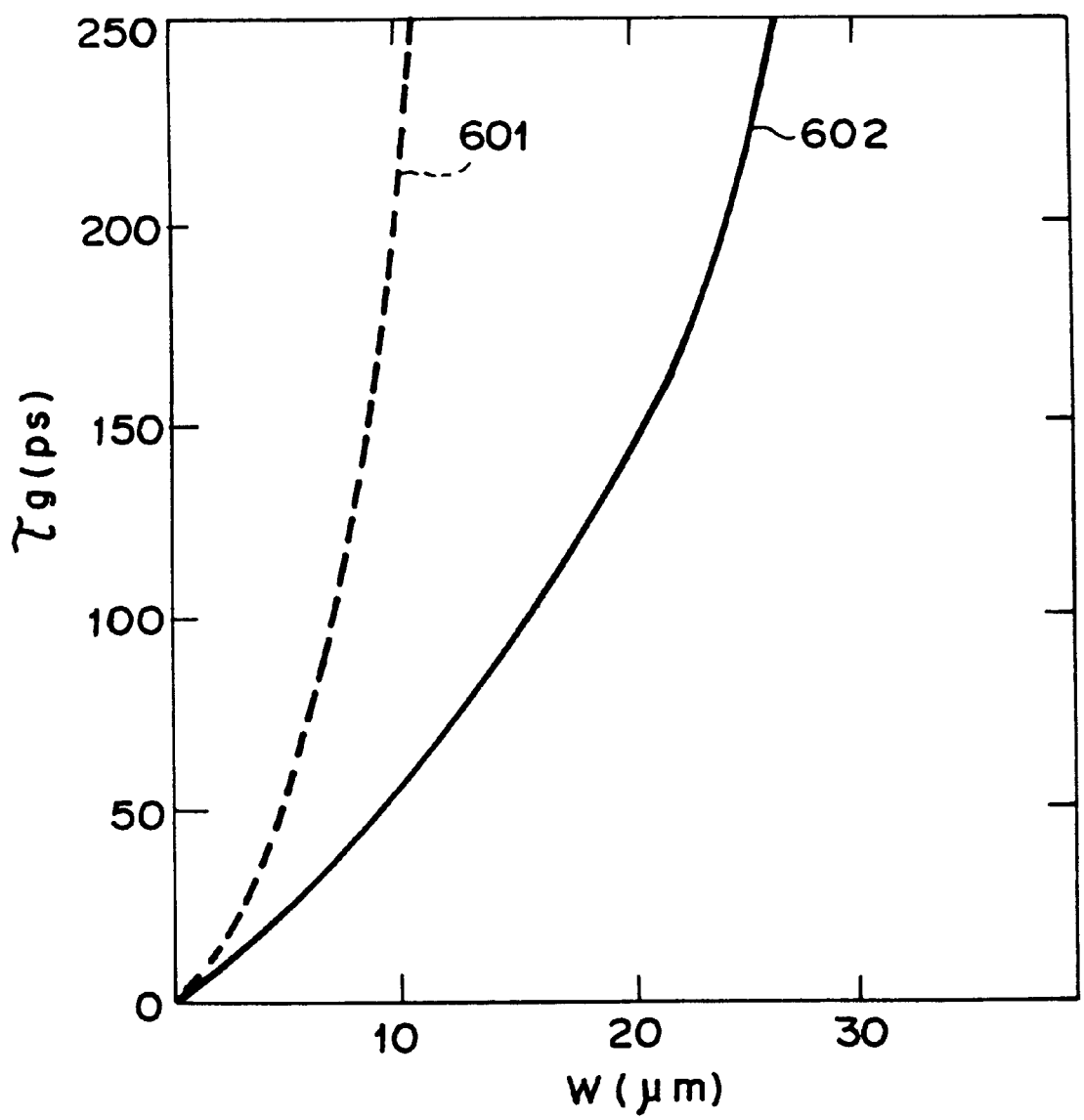
FIG. 9 is a view for explaining the dependency of the time constant ($\tau_g$) of the gate on the gate width (W).

FIG. 9 illustrates the dependency of the time constant $\tau_g$ (ps) of the gate on the gate width W (μm) in the structure of FIGS. 8A through 8C by comparing that of the conventional structure (601) with that of the first embodiment structure of the present invention (602). As seen from FIG. 9, the basic cell structure of the present invention permits the time constant of the gate to be suppressed sufficiently for a device having a gate length (L) of 0.25 μm even without appling the silicide process to the polysilicon gate.

The gate width of the P-channel MOS transistor and the N-channel MOS transistor may be equal to or less than 7 μm, preferably equal to or less than 5 μm, and greater than 0 μm. The gate length of the P-channel MOS transistor and the N-channel MOS transistor may be equal to or less than 0.3 μm, preferably equal to or less than 0.25 μm, and greater than 0 μm.

Figure 6A:
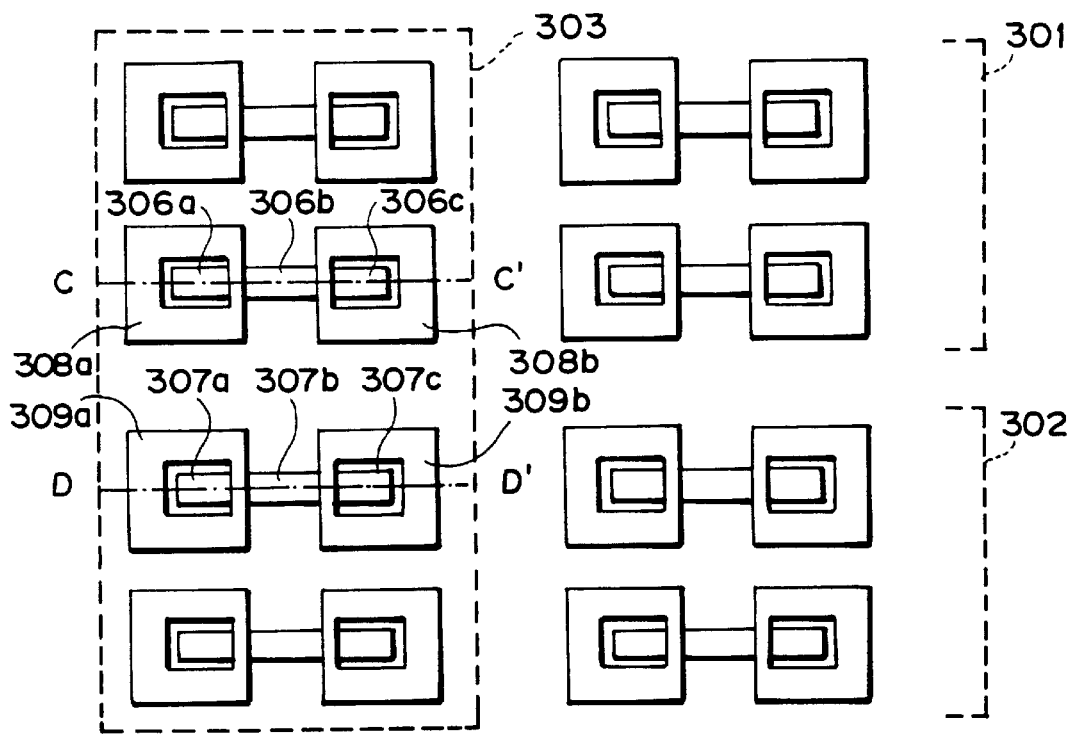
FIG. 6A is a plan view illustrating a layout of a basic cell array according to a second embodiment of the present invention.

FIG. 6A is a view of the internal basic cell layout of the LSI illustrating a second embodiment of the present invention, in which the present invention is applied to an SOI (Si-On-Insulator) substrate such as a SIMOX (Separation by IMplantation of OXygen) substrate or the like.

Referring to FIG. 6A, reference numeral 301 denotes a group of P-channel MOS transistors, 302 a group of N-channel MOS transistors, 303 a basic cell, 306a, 306b, 306c each a $P^+$-type diffusion layer, 307a, 307b, 307c an $N^+$-type diffusion layer, 308a, 308b a P-channel MOS gate, 309a, 309b an N-channel MOS gate.

That is, the basic cell 303 according to this embodiment comprises a group 301 of four P-channel MOS transistors and a group 302 of four N-channel MOS transistors. In the group 301, each two P-channel MOS transistors are connected in series in such a manner as sharing a source or drain area 306b. In the group 302, each two N-channel MOS transistors are connected in series in such a manner as sharing a source or drain area 307b, as in the first embodiment.

The P-channel MOS gates 308a, 308b have the gate width ($W_P$) below 5 μm and surround the $P^+$-type diffusion layers 306a, 306c respectively. Also, the N-channel MOS gates 309a, 309b have the gate width ($W_N$) below 5 μm and surround the $N^+$-type diffusion layers 307a, 307c respectively. The P-channel MOS gates 308a, 308b and the N-channel MOS gates 309a, 309b each form an electrically closed loop.

Unlike the first embodiment of FIGS. 4A through 4C, the second embodiment has a feature that the N-well contact diffusion layer and the P-well contact diffusion layer are eliminated from the basic cell. According to such a structure, it is possible to realize higher integration.

Figure 6B:
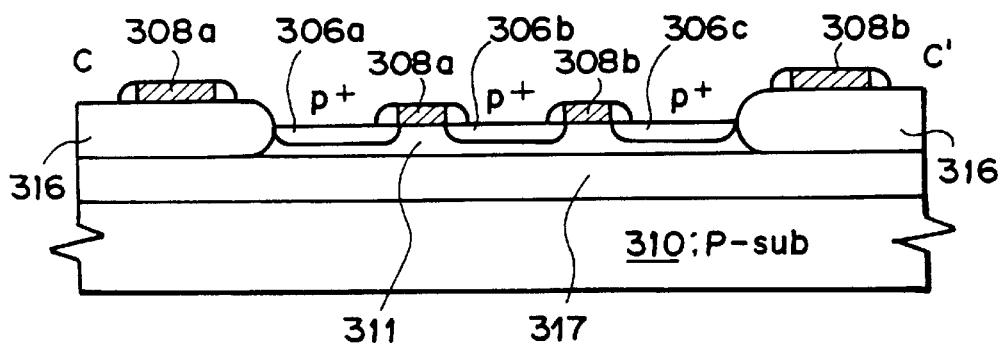
FIG. 6B is a cross-sectional view of the interior of a P-channel MOS transistor prtion of a basic cell.
Figure 6C:
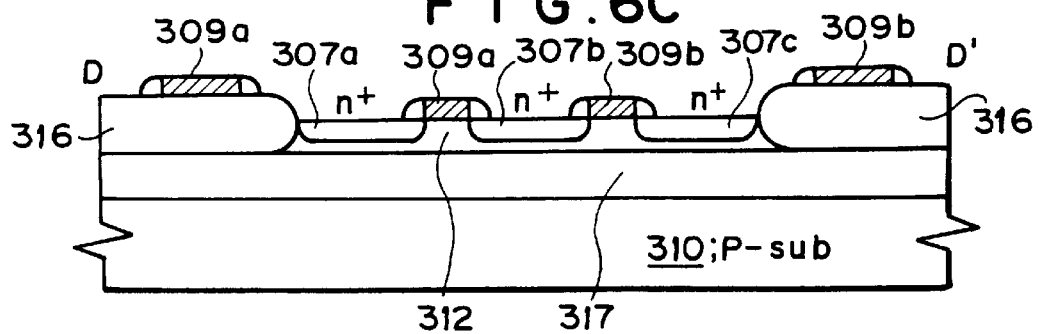
FIG. 6C is a cross-sectional view of the interior of an N-channel MOS transistor portion of the basic cell.

FIG. 6B is a cross-sectional view of the P-channel MOS transistor portion taken along the line C–C' of FIG. 6A, and FIG. 6C is a cross-sectional view of the N-channel MOS transistor portion taken along the line D–D' of FIG. 6A. In FIGS. 6B and 6C, 310 denotes a P-type substrate (P-sub), 311 an $N^-$-type layer, 312 a $P^-$-type layer, 316 an isolation oxide film, and 317 an buried oxide film.

Referring to the cross-sectional view of FIG. 6B, the P-channel MOS gates 308a, 308b of the basic cell 303 according to this embodiment are formed at the transistor portion and on the isolation oxide film 316. Referring also to the cross-sectional view of FIG. 6C, the N-channel MOS gates 309a, 309b of the basic cell 303 according to this embodiment are formed at the transistor portion and on the isolation oxide film 316.

Also in this embodiment, as in the first embodiment, a PMOS and an NMOS are of surface channel type having a gate length (L) of 0.25 μm, and the P-channel MOS gates 308a, 308b are formed of P-type polysilicon, and the N-channel MOS gates 309a, 309b are formed of N-type polysilicon.

This embodiment of FIGS. 6A through 6C differs from the first embodiment of FIGS. 4A through 4C in that the buried oxide film 317 is present on the P-type substrate (P-sub) 310.

Figure 7A:
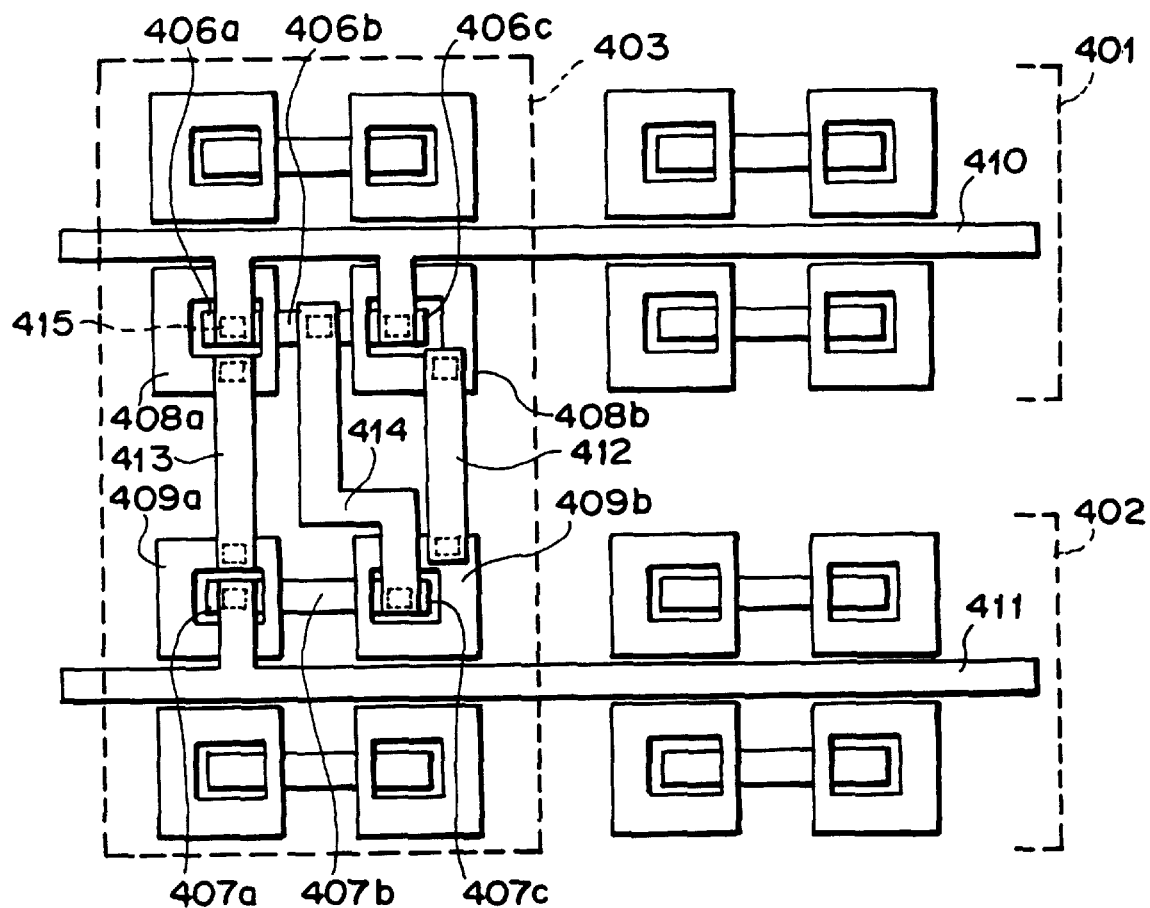
FIG. 7A is a plan view of the wiring layout of a two-input NAND circuit according to the second embodiment of the present invention.

FIG. 7A shows a layout in which an interconnection pattern of two-input NAND circuit is laid out on the basic cell array of FIGS. 6A through 6C, and FIG. 7B is an equivalent circuit diagram of the two-input NAND circuit.

Figure 7B:
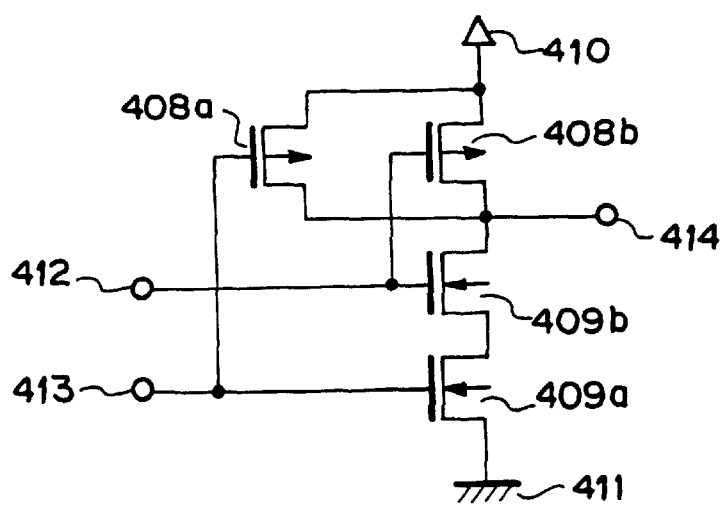
FIG. 7B is an equivalent circuit diagram thereof.

In FIGS. 7A and 7B, 401 denotes a group of P-channel MOS transistors, 402 a group of N-channel MOS transistors, 403 a basic cell, 406a, 406b, 406c each a $P^+$-type diffusion layer, 407a, 407b, 407c an $N^+$-type diffusion layer, 408a, 408b a P-channel MOS gate, 409a, 409b an N-channel MOS gate, 410 a power line, 411 a ground line, 412 a first input terminal line, 413 a second input terminal line, 414 an output terminal line, and 415 a contact.

In this embodiment, the power supply potential is given from the power line 410 through the contact 415 to the P$^+$-type diffusion layers 406$a$, 406$c$, and the ground potential is given from the ground line 411 through the contact 415 to the the N$^+$-type diffusion layer 407$a$.

The P-channel MOS gate 408$a$ and the N-channel MOS gate 409$a$ are connected to each other with the second input terminal line 413, and the P-channel MOS gate 408$b$ and the N-channel MOS gate 409$b$ are connected to each other with the first input terminal line 412, and the P$^+$-type diffusion layer 406$b$ and the N$^+$-type diffusion layer 407$c$ are connected to each other with an output terminal line 414.

In this second embodiment, as shown in FIG. 7A, since there are no N-well and P-well contact diffusion layers, the two-input NAND circuit can be formed small as compared with that of FIG. 5A.

Further, since the buried oxide film 317 is present as shown in FIGS. 6B and 6C, it is possible to make the gate capacitance smaller than in the first embodiment. For example, if, with the thickness of the buried oxide film 317 set to 4000 Å, the time constant of the gate is calculated for the structure of FIGS. 8A through 8C, then, in FIG. 9, it becomes smaller by about 15% than the data 602 of the first embodiment of the present invention.

Therefore, it can be understood that when the present invention is applied to the SOI substrate such as the SIMOX substrate or the like as in the second embodiment, the improvement in the characteristics becomes greater.

As described above, according to the present invention, the effect exerted on the operating speed of the circuit by the gate resistance can be suppressed by reducing the gate width of the MOS transistor forming the internal basic cell and by making the gate electrode in the form surrounding the perimeter of the source or drain diffusion layer without using the gate silicide or salicide process. Incidentally, from 12 to 18 manufacturing steps can be eliminated by eliminating the gate silicide or salicide process.

It will be needless to say that the present invention is not always restricted to the foregoing embodiments, but can also be implemented if modified in various ways within the scope or spirit of the present invention.

As described above, according to the present invention, a semiconductor integrated circuit which allows the degradation of the operating speed of the circuit, which is incurred by the increase of the gate resistance involved with making the size of the device small, to be suppressed can be provided.

What is claimed is:

1. A semiconductor device, comprising:

first and second MOS transistors formed in a common substrate;

said first transistor including first and second areas of the same doping type with a first channel region located therebetween and a first gate electrode covering said first channel region and having a resistance;

said second transistor including first and second areas of the same doping type with a second channel region located therebetween and a second gate electrode covering said second channel region and having a resistance;

a first resistor formed on said substrate at a location laterally removed from said first gate electrode away from the first channel region of the first transistor and being electrically coupled in parallel with said first gate electrode and having a resistance which reduces the effective resistance of said first gate electrode, said first resistor not defining a gate electrode of any other transistor; and a second resistor formed on said substrate at a location laterally removed from said second gate electrode away from the second channel region of the second transistor and being electrically coupled in parallel with said second gate electrode and having a resistance which reduces the effective resistance of said second gate electrode, said second resistor not defining a gate electrode of any other transistor;

wherein said first areas of said first and second transistors are in direct contact with one another; and wherein said first and second resistors do not electrically couple said first and second transistors to any other transistors formed on said common substrate.

2. A semiconductor device according to claim 1, wherein:

said first resistor and said first gate electrode together form a closed loop surrounding said second area of said first transistor; and said second resistor and said second gate electrode together form a closed loop surrounding said second area of said second transistor.

3. A semiconductor device according to claim 2, wherein said second area of the first transistor and the second area of the second transistor are non-adjacent to and electrically isolated from each another.

4. A semiconductor device according to claim 1, wherein:

said first gate electrode has a gate length and said first resistor is a first conductor formed on said substrate, said first conductor having a width which is significantly larger than said gate length of said first gate electrode; and said second gate electrode has a gate length and said second resistor is a second conductor formed on said substrate, said second conductor having a width which is significantly larger than said gate length of said second gate electrode.

5. A semiconductor device according to claim 1, wherein said second area of the first transistor and the second area of the second transistor are non-adjacent to and electrically isolated from each another.

6. A semiconductor device according to claim 1, wherein said first and second transistors are electrically isolated via said common substrate from any other transistors formed on said common substrate.

7. A semiconductor device according to claim 1, wherein each of said first areas of said first and second transistors is a drain and each of said second areas of said first and second transistors is a source.

8. A semiconductor device according to claim 1, wherein a gate width of each of said gate electrodes of said first and second transistors is equal to or less than 7 $\mu$m.

9. A semiconductor device according to claim 8, wherein a gate length of each of said gate electrodes of said first and second transistors is equal to or less than 0.3 $\mu$m.

10. A semiconductor device according to claim 1, wherein a gate length of each of said gate electrodes of said first and second transistors is equal to or less than 0.3 $\mu$m.

11. A semiconductor device according to claim 1, wherein said first areas of the first and second transistors and second areas of the first and second transistors are p-type areas.

12. A semiconductor device according to claim 11, wherein each of said first and second gate electrodes is formed of p-type polysilicon.

13. A semiconductor device according to claim 1, wherein said first areas of the first and second transistors and second areas of the first and second transistors are n-type areas.

14. A semiconductor device according to claim 13, wherein each of said first and second gate electrodes is formed of n-type polysilicon.

15. A semiconductor device according to claim 1, wherein said common substrate is an SOI substrate.

16. A semiconductor device according to claim 1, wherein said first gate electrode is made of the same material as said first resistor and said second gate electrode is made of the same material a s said second resistor.

17. A CMOS semiconductor device, comprising:

(a) a first p-type MOS transistor formed in a semiconductor substrate and including first and second areas of the same doping type with a first channel region located therebetween and a first gate electrode covering said first channel region and having a resistance;

(b) a second p-type MOS transistor formed in said semiconductor substrate and including first and second areas of the same doping type with a second channel region located therebetween and a second gate electrode covering said channel region and having a resistance;

(c) a first resistor formed on said substrate at a location laterally removed from said first gate electrode away from the first channel region of the first p-type MOS transistor and being electrically coupled in parallel with said first gate electrode and having a resistance which reduces the effective resistance of said first gate electrode, said first resistor not defining a gate electrode of any other transistor;

(d) a second resistor formed on said substrate at a location laterally removed from said second gate electrode away from the second channel region of the second p-type MOS transistor and being electrically coupled in parallel with said second gate electrode and having a resistance which reduces the effective resistance of said second gate electrode, said second resistor not defining a gate electrode of any other transistor;

(e) a first n-type MOS transistor formed in said substrate and electrically isolated via said substrate from said first and second p-type MOS transistors, said first n-type MOS transistor including first and second areas of the same doping type with a third channel region located therebetween and a third gate electrode covering said third channel region and having a resistance;

(f) a second n-type MOS transistor formed in said substrate and electrically isolated via said substrate from said first and second p-type MOS transistors, said second n-type MOS transistor including first and second areas of the same doping type with a fourth channel region located therebetween and a fourth gate electrode covering said fourth channel region and having a resistance;

(g) a third resistor formed on said substrate at a location laterally removed from said third gate electrode away from the third channel region of the first n-type MOS transistor and being electrically coupled in parallel with said third gate electrode and having a resistance which reduces the effective resistance of said third gate electrode, said third resistor not defining a gate electrode of any other transistor; and (h) a fourth resistor formed on said substrate at a location laterally removed from said fourth gate electrode away from the fourth channel region of the second n-type MOS transistor and being electrically coupled in parallel with said fourth gate electrode and having a resistance which reduces the effective resistance of said fourth gate electrode, said fourth resistor not defining a gate electrode of any other transistor, wherein said second areas of each of said first and second p-type MOS transistors and said second areas of each of said first and second n-type MOS transistors are non-adjacent to and electrically isolated from each other and said first areas of each of said first and second p-type MOS transistors and said first areas of each of said first and second n-type MOS transistors are in contact with each other; and wherein said first through fourth resistors do not electrically couple said first and second p-type MOS transistors and said first and second n-type MOS transistors to any other transistors formed on said substrate.

18. A semiconductor device according to claim 17, wherein:

said first resistor and said first gate electrode together form a closed loop surrounding said second area of said first p-type MOS transistor;

said second resistor and said second gate electrode together form a closed loop surrounding said second area of said second p-type MOS transistor;

said third resistor and said third gate electrode together form a closed loop surrounding said second area of said first n-type MOS transistor; and said fourth resistor and said fourth gate electrode together form a closed loop surrounding said second area of said second n-type MOS transistor.

19. A semiconductor device according to claim 17, wherein a gate width of each of said first, second, third and fourth gate electrodes is equal to or less than 7 μm.

20. A semiconductor device according to claim 19, wherein a gate length of each of said first, second, third and fourth gate electrodes is equal to or less than 0.3 μm.

21. A semiconductor device according to claim 17, wherein a gate length of each of said first, second, third and fourth gate electrodes is equal to or less than 0.3 μm.

22. A semiconductor device according to claim 17, wherein said first gate electrode is made of the same material as said first resistor, said second gate electrode is made of the same material as said second resistor, said third gate electrode is made of the same material as said third resistor and said fourth gate electrode is made of the same material as said fourth resistor.

* * * * *